United States Patent [19]
Elman et al.

[11] Patent Number: 4,647,403
[45] Date of Patent: Mar. 3, 1987

[54] ION IMPLANTED POLYDIACETYLENES

[75] Inventors: Boris S. Elman, Allston; Daniel J. Sandman, Acton; Sukant K. Tripathy, Arlington; Mrinal K. Thakur, Waltham, all of Mass.

[73] Assignee: GTE Laboratories Incorporated, Waltham, Mass.

[21] Appl. No.: 630,484

[22] Filed: Jul. 13, 1984

[51] Int. Cl.$^4$ ................................................ H01B 1/06
[52] U.S. Cl. ..................................... 252/512; 252/518; 526/285; 524/408; 524/439
[58] Field of Search ................ 252/500, 512; 526/285; 524/408, 439; 204/159.14, 159.15; 427/38, 40; 523/375

[56] References Cited

U.S. PATENT DOCUMENTS

| | | | |
|---|---|---|---|
| 4,204,216 | 5/1980 | Helger et al. | 252/500 |
| 4,452,827 | 1/1984 | Kolev et al. | 427/38 |
| 4,491,605 | 1/1985 | Mazurek et al. | 252/500 |

FOREIGN PATENT DOCUMENTS

| | | |
|---|---|---|
| 197807 | 7/1978 | Canada . |
| 0145743 | 3/1983 | Japan . |
| 145743 | 3/1983 | Japan . |

*Primary Examiner*—Josephine L. Barr
*Attorney, Agent, or Firm*—Martha Ann Finnegan; David M. Keay

[57] ABSTRACT

Ion implanted polydiacetylenes prepared by implanting ions into substituted polydiacetylenes at fluence levels from about $1 \times 10^{13}$ ions/cm$^2$ to about $1 \times 10^{17}$ ions/cm$^2$ are disclosed. Ion implanted polydiacetylenes exhibit electrical and/or optical properties which are different from those of untreated polydiacetylenes.

8 Claims, No Drawings

ION IMPLANTED POLYDIACETYLENES

BACKGROUND OF THE INVENTION

This invention relates to electrically conductive diacetylene polymers. More particularly, it is concerned with structurally modified polydiacetylenes.

The general chemical structure for polydiacetylenes is

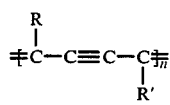

where R and R' are suitably chosen side groups which will vary from polymer to polymer. The fully conjugated backbone of the polydiacetylene provides a one-dimensional electronic structure, well insulated from other chains by the bulky side groups, R and R'.

Polydiacetylenes are formed through a topochemical solid state polymerization when diacetylene monomers are subjected to thermal or a variety of radiative excitations. The resulting polydiacetylene is in the form of a macroscopic "perfect" single crystal often with dimensions greater than one millimeter on all sides. The polydiacetylene crystals are highly anisotropic and can be made essentially defect free. The polymer may also be obtained in the form of a monolayer or multilayer film.

Fully crystalline polydiacetylenes have been reported to exhibit carrier mobilities comparable to silicon or gallium arsenide. For example, the diacetylene polymer from the bis(p-toluene-sulfonate) of 2,4-hexadiyne-1,6-diol (PTS) has been reported to exhibit exceptionally high carrier mobilities along its chain direction, $\mu \sim 20$ m$^2$S$^{-1}$V$^{-1}$. The long carrier mean free paths implied clearly follow from the full order of these polymers. Polydiacetylenes may have application in all optical signal processing due to the very high values of their third-order nonlinear susceptibilities $X^3(\omega)$.

A major limitation in employing polydiacetylenes as an electronic material is the relative inability to systematically create major changes in the electrical and optical properties of these materials. Previously reported attempts to chemically create changes in the electrical and optical properties of PTS and other polydiacetylenes by halogen oxidation have been generally unsuccessful.

Although very high carrier mobilities have been reported for polydiacetylenes, their applications as electronic materials have been limited by the inability to chemically or otherwise modify the electronic properties, such as electrical conductivity, prior to the present invention.

SUMMARY OF THE INVENTION

This invention is directed to polydiacetylenes having structures which have been modified by ion implantation. Ion implanted polydiacetylenes in accordance with the present invention exhibit electrical and/or optical properties different from those of untreated polydiacetylenes. The modification of the electrical or optical properties are modified is dependent upon the fluence level of the ion implantation.

In accordance with this invention there is provided ion implanted polydiacetylene which is prepared by implanting ions into polydiacetylene at a fluence level from approximately $1 \times 10^{13}$ ions/cm$^2$ to approximately $1 \times 10^{17}$ ions/cm$^2$.

Polydiacetylene, or diacetylene polymers, which can be ion implanted to produce the material of this invention are represented by the formula

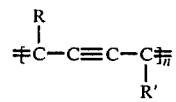

wherein R and R' are carbon containing side groups.

More specifically, suitably chosen R—R' pairs include:

R=—CH$_2$OSO$_2$C$_6$H$_4$CH$_3$ and R'=—CH$_2$OSO$_2$C$_6$H$_4$CH$_3$;
R=—CH$_2$OCONHC$_6$H$_5$ and R'=—CH$_2$OCONHC$_6$H$_5$;
R=—(CH$_2$)$_3$OCONHC$_6$H$_5$ and R'=—(CH$_2$)$_3$OCONHC$_6$H$_5$;
R=—(CH$_2$)$_4$OCONHC$_6$H$_5$ and R'=—(CH$_2$)$_4$OCONHC$_6$H$_5$;
R=—(CH$_2$)$_4$OCONHC$_3$H$_5$ and R'=—(CH$_2$)$_4$OCONHC$_2$H$_5$;
R=—(CH$_2$)$_4$OCONHCH(CH$_3$)$_2$ and R'=—(CH$_2$)$_4$OCONHCH(CH$_3$)$_2$;
R=—(CH$_2$)$_n$OCONHCH$_2$COOZ and R'=—(CH$_2$)$_n$OCONHCH$_2$COOZ, wherein Z is an alkyl or aryl group;
R=—CH$_2$NC$_{12}$H$_8$ and R'=—CH$_2$NC$_{12}$H$_8$;
R=—(CH$_2$)$_2$OH and R'=—(CH$_2$)$_2$OH;
R=—(CH$_2$)$_3$OH and R'=—(CH$_2$)$_3$OH;
R=—COO(CH$_2$)$_8$CH$_3$ and R'=—COO(CH$_2$)$_8$CH$_3$;
R=—CH$_2$OH and R'=CH$_3$;
R=(CH$_2$)$_n$CH$_3$ and R'=—(CH$_2$)$_m$COOH, wherein n and m are different integers; and
R=—(CH$_2$)$_n$CH$_3$ and R'=—(CH$_2$)$_m$COO—Li$^+$, wherein n and m are different integers.

DETAILED DESCRIPTION OF THE INVENTION

The composition of the present invention is an ion implanted polydiacetylene, the polydiacetylene having been implanted with ions of any chemical element at fluence level from approximately $1 \times 10^{13}$ ions/cm$^2$ to approximately $1 \times 10^{17}$ ions/cm$^2$. Fragments of molecules can also be implanted into polydiacetylenes to produce ion implanted polydiacetylenes. The polydiacetylene which is ion implanted to produce the ion implanted polydiacetylene of the present invention is represented by the general formula:

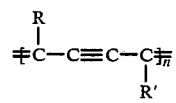

wherein R and R' are carbon containing side groups.

More specifically, suitably chosen R—R' pairs include:

R=—CH$_2$OSO$_2$C$_6$H$_4$CH$_3$ and R'=—CH$_2$OSO$_2$C$_6$H$_4$CH$_3$;
R=—CH$_2$OCONHC$_6$H$_5$ and R'=—CH$_2$OCONHC$_6$H$_5$;
R=—(CH$_2$)$_3$OCONHC$_6$H$_5$ and R'=—(CH$_2$)$_3$OCONHC$_6$H$_5$;

$R = -(CH_2)_4OCONHC_6H_5$ and $R' = -(CH_2)_4OCONHC_6H_5$;

$R = -(CH_2)_4OCONHC_2H_5$ and $R' = -(CH_2)_4OCONHC_2H_5$;

$R = -(CH_2)_4OCONHCH(CH_3)_2$ and $R' = -(CH_2)_4OCONHCH(CH_3)_2$;

$R = -(CH_2)_nOCONHCH_2COOZ$ and $R' = -(CH_2)_nOCONHCH_2COOZ$, wherein Z is an alkyl or aryl group;

$R = -CH_2NC_{12}H_8$ and $R' = -CH_2NC_{12}H_8$;

$R = -(CH_2)_2OH$ and $R' = -(CH_2)_2OH$;

$R = -(CH_2)_3OH$ and $R' = -(CH_2)_3OH$;

$R = -COO(CH_2)_8CH_3$ and $R' = -COO(CH_2)_8CH_3$;

$R = -CH_2OH$ and $R' = CH_3$;

$R = (CH_2)_nCH_3$ and $R' = -(CH_2)_mCOOH$, wherein n and m are different integers; and $R = -(CH_2)_nCH_3$ and $R' = -(CH_2)_8COO-Li^+$, wherein n and m are different integers.

The method of implanting ions into polydiacetylene involves placing crystalline diacetylene polymer represented by the formula

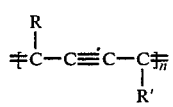

in a vacuum of about $10^{-4}$ to $10^{-5}$ torr and exposing the diacetylene polymer to a beam of ions at an accelerating voltage between about 20 keV and 10 MeV to produce an ion implanted polydiacetylene having fluence level from about $1 \times 10^3$ ions/cm$^2$ to about $1 \times 10^{17}$ ions/cm$^2$. It is desirable to use low current densities for implantation in order to minimize the heating of the crystalline substrate by the ion beam.

By using ion implantation to modify the structure and properties of polydiacetylene it is possible to implant atoms of any element of the periodic table and even fragments of molecules. The tightly packed polydiacetylene crystalline lattice largely precludes chemical-charge-transfer doping of polydiacetylenes to the extent necessary to produce a change in the properties of the polymer. Moreover, implantation can be carried out at temperatures at which diffusion in completely negligible.

Polydiacetylene implanted with ions at fluence levels from about $1 \times 10^{13}$ ions/cm$^2$ to about $1 \times 10^{17}$ ions/cm$^2$ has a modified structure and improved optical and/or electrical properties. The improved optical properties are observed in ion implanted polydiacetylenes at fluence levels from about $1 \times 10^{13}$ ions/cm$^2$ to about $5 \times 10^{15}$ ions/cm$^2$. The improved electrical properties, e.g., increased electrical conductivity, are observed in ion implanted polydiacetylenes at fluence levels above $1 \times 10^{14}$ ions/cm$^2$.

The following examples are provided to illustrate the beneficial effects of the present invention and are not to be construed as necessarily limiting thereof.

Examples 1 through 5 are directed to an ion implanted PTS-polydiacetylene ($R = R' = -CH_2OSO_2C_6H_4CH_3$).

EXAMPLE 1

A PTS-polydiacetylene sample having the approximate dimensions of $5 \times 3 \times 1$ mm$^3$ was implanted with $^{75}$As ions at an accelerating voltage of 150 keV. The implantation was performed on a Varian/Extrion Production Ion Implanter Model 200-DF4. The sample was implanted at ambient temperature under a vacuum of $\sim 10^{-5}$ torr. The ion beam current density was less than 2 $\mu$A/cm$^2$ in order to minimize the beam heating effect in the sample. The calculated penetration depth of ions implanted into the sample is $\sim 0.11$ micron (1100 Angstroms). The fluence level of ions implanted into the sample was $\sim 1 \times 10^{13}$ ions/cm$^2$.

EXAMPLE 2

A PTS-polydiacetylene sample was implanted with $^{75}$As ions at a fluence level of about $5 \times 10^{13}$ ions/cm$^2$, under the conditions described in Example 1.

EXAMPLE 3

A PTS-polydiacetylene sample was implanted with $^{75}$As ions at a fluence level of about $1 \times 10^{14}$ ions/cm$^2$, under the conditions described in Example 1.

EXAMPLE 4

A PTS-polydiacetylene sample was implanted with $^{75}$As ions at a fluence level of about $5 \times 10^{14}$ ions/cm$^2$, under the conditions described in Example 1.

EXAMPLE 5

A PTS-polydiacetylene sample was implanted with $^{75}$As ions at a fluence level of about $1 \times 10^{15}$ ions/cm$^2$, under the conditions described in Example 1.

The physical appearance of the ion implanted PTS-polydiacetylene samples of Examples 1 through 5 changed as the fluence level of the $^{75}$As ions implanted into PTS-polydiacetylene was increased. Unimplanted PTS-polydiacetylene is dark yellow in color. The surface color of the unimplanted PTS-polydiacetylene changed from dark yellow to purple at $1 \times 10^{13}$ ions/cm$^2$ (Example 1); to blue at $5 \times 10^{13}$ ions/cm$^2$ (Example 2); to green at $1 \times 10^{14}$ ions/cm$^2$ (Example 3); to dark green at $5 \times 10^{14}$ ions/cm$^2$ (Example 4); to black at $1 \times 10^{15}$ ions/cm$^2$ (Example 5).

After implantation at $\phi \geq 1 \times 10^{15}$ ions/cm$^2$, the crystalline PTS-diacetylene polymer loses its surface anisotropy. This loss of surface anisotropy was observed by the reflection geometry under cross-polarized light.

An increase in electrical conductivity for polydiacetylenes implanted with ions at fluence levels above $1 \times 10^{14}$ ions/cm$^2$ is demonstrated by room temperature d.c. conductivity measurements made on the ion implanted materials of Examples 4 and 5. The room temperature d.c. conductivity of unimplanted PTS-polydiacetylene is $\sim 10^{-12}$ (ohm-cm)$^{-1}$. W. Schermann et al., Markromol. Chem. 175, 667 (1974). The room temperature d.c. conductivity for the ion implanted sample of Example 4 (fluence $\sim 5 \times 10^{14}$ ions/cm$^2$) was $\sim 10^{-7}$ (ohm-cm)$^{-1}$. The room temperature d.c. conductivity for the ion implanted sample of Example 5 (fluence $\sim 1 \times 10^{15}$ ions/cm$^2$) was $\sim 2 \times 10^{-5}$ (ohm-cm)$^{-1}$.

The structural changes of PTS-polydiacetylene after implantation were studied by means of Raman Spectroscopy, Rutherford Backscattering Spectrometry (RBS) and Electron Spectroscopy for Chemical Analysis (ESCA) techniques using the materials of Examples 1-5. The RBS results show that at fluences below $1 \times 10^{15}$ ions/cm$^2$ the side groups, R and R', are primarily affected by the ion beam, leading to formation of a sulfur rich region near the surface of the ion implanted PTS-polydiacetylene sample. The ESCA results further show the sulfur atoms to be present in two clearly distinct chemical states: sulfur is present as it exists in its original environment in the unimplanted material and sulfur is present in a state similar in binding energy to that of sulfur in $S_n$ complexes. RBS results further show that when the side groups are strongly affected by the ion beam, the polydiacetylene backbone is untouched by the beam. This is most probably due to the strong carbon-carbon interaction along the polydiacetylene backbone.

While Examples 1–5, used to illustrate the structural modifications of ion implanted polydiacetylene at fluences from $10^{13}$ ions/cm$^2$ to $10^{16}$ ions/cm$^2$, are directed to polydiacetylene-bis-(para-toluene sulfonate), differently substituted polydiacetylenes implanted in the range of fluences from $10^{13}$ ions/cm$^2$ to $10^{17}$ ions/cm$^2$ will exhibit analogous structural modifications. (The modified electrical properties of ion implanted polydiacetylenes will be discussed more fully below.)

Example 6 is directed to ion implanted TCDU-polydiacetylene ($R=R'=-(CH_2)_4OCONHC_6H_5$).

EXAMPLE 6

Large area single crystal TCDU-polydiacetylene samples having the approximate dimensions of $10 \times 10 \times 10^{-3}$ mm$^3$ were implanted with $^{75}$As ions at an accelerating voltage of 150 keV. The implantation was performed on a Varian/Extrion Production Ion Implanter Model 200-DF4. The samples were implanted at ambient temperature under a vacuum of about $\sim 10^{-5}$ torr. The ion beam current density was less than 2 $\mu$A/cm$^2$ in order to minimize the beam heating effect in the samples. The calculated penetration depth of ions implanted into the samples is $\sim 0.126$ micron (1260 Angstroms). The samples were implanted at fluences from $1 \times 10^{13}$ ions/cm$^2$ to $5 \times 10^{15}$ ions/cm$^2$.

Absorption spectra in the visible range have been recorded for TCDU-polydiacetylene samples before and after implantation. Significant changes in the optical absorption of TCDU-polydiacetylene are achieved by ion implantation. The onset of the optical absorption shifted to lower energy as the fluence was increased from $1 \times 10^{13}$ ions/cm$^2$ to $5 \times 10^{15}$ ions/cm$^2$. The resulting low-energy band-gap ion implanted TCDU-polydiacetylene will have high nonlinear susceptibility and will be suitable for integrated optical applications.

While the examples used to illustrate the optical properties of ion implanted polydiacetylenes are directed to ion-implanted TCDU-polydiacetylene, ion implanted polydiacetylenes at fluences of about $1 \times 10^{13}$ ions/cm$^2$ to about $5 \times 10^{15}$ ions/cm$^2$, having different R—R' pairs, will exhibit analogous optical properties.

Examples 7 through 9 are directed to ion implanted DCH-polydiacetylene ($R=R'=-C_2NC_{12}H_8$).

EXAMPLE 7

A sample of DCH-polydiacetylene having the approximate dimensions of $7 \times 3 \times 1$ mm$^3$ was implanted with $^{75}$As ions at an accelerating voltage of 150 keV. The implantation was performed on a Varian/Extrion Production Ion Implanter Model 200-DF4. The sample was implanted at ambient temperature under a vacuum of about $10^{-5}$ torr. The ion beam current density was less than 2 $\mu$A/cm$^2$ in order to minimize the beam heating effect in the sample. The calculated penetration depth of ions implanted into the DCH-polydiacetylene sample at E=150 keV is $\sim 0.132$ micron (1320 Angstroms). The fluence level of ions implanted into the sample was about $5 \times 10^{14}$ ions/cm$^2$.

EXAMPLE 8

A DCH-polydiacetylene sample was implanted with $^{75}$As ions at a fluence level of about $1 \times 10^{15}$ ions/cm$^2$, under the conditions described in Example 7.

EXAMPLE 9

A DCH-polydiacetylene sample was implanted with $^{75}$As ions at a fluence level of about $5 \times 10^{15}$ ions/cm$^2$, under the conditions described in Example 7.

The physical appearance of the ion implanted DCH-polydiacetylene samples of Examples 7 through 9 changed as the fluence level of the $^{75}$As ions implanted into DCH-polydiacetylene was increased. Unimplanted DCH-polydiacetylene is dark yellow in color. The surface color of the unimplanted DCH-polydiacetylene changed from dark yellow to dark green at $5 \times 10^{14}$ ions/cm$^2$ (Example 7); to black at fluences of $1 \times 10^{15}$ ions/cm$^2$ and above (Examples 8 and 9).

An increase in the electrical conductivity for polydiacetylenes implanted with ions at fluence levels above $1 \times 10^{14}$ ions/cm$^2$ is demonstrated by room temperature d.c. Conductivity measurements made on the ion implanted materials of Examples 7 through 9. The room temperature d.c. conductivity of unimplanted DCH-polydiacetylene is $\sim 10^{-15}$ (ohm-cm)$^{-1}$. K. C. Yee et al, J. Polym. Sci., Polym. Phys. Ed., 16, 431 (1978). The room temperature d.c. conductivity for the ion implanted sample of Example 7 (fluence $\sim 5 \times 10^{14}$ ions/cm$^2$) was $\sim 2 \times 10^{-7}$ (ohm-cm)$^{-1}$. The room temperature d.c. conductivity for the ion implanted sample of Example 8 (fluence $\sim 1 \times 10^{15}$ ions/cm$^2$) was $\sim 5 \times 10^{-5}$ (ohm-cm)$^{-1}$. The room temperature d.c. conductivity of the ion implanted sample of Example 9 (fluence $\sim 5 \times 10^{15}$ ionc/cm$^2$) was $\sim 1$ (ohm-cm)$^{-1}$.

The electrical properties of ion implanted polydiacetylenes are improved over those of unimplanted polydiacetylene at fluences from about $1 \times 10^{14}$ ions/cm$^2$ and above. The conductivity of the ion implanted polydiacetylenes is saturated at fluences $\geq 1 \times 10^{16}$ ions/cm$^2$.

While the examples used to illustrate the electrical properties of ion implanted polydiacetylenes are directed to ion implanted DCH-polydiacetylenes, ion implanted diacetylene polymers at fluences from about $1 \times 10^{14}$ ions/cm$^2$ to about $1 \times 10^{17}$ ions/cm$^2$ having different R—R' pairs, will exhibit analagous electrical properties.

While several embodiments of the invention have been described, it will be readily understood by those skilled in the art that the above embodiments should not be construed at limiting the scope of this invention in any way.

What is claimed is:

1. Ion implanted polydiacetylene prepared by implanting ions of a chemical element into fully conjugated, fully ordered crystalline polydiacetylene at a fluence level from approximately $1 \times 10^{13}$ ions/cm$^2$ to about $1 \times 10^{17}$ ions/cm$^2$, wherein the polydiacetylene is represented by the formula

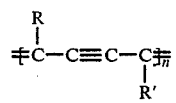

wherein R and R' are carbon containing side groups.

2. Ion implanted polydiacetylene prepared by implanting ions of a chemical element into fully conjugated, fully ordered crystalline polydiacetylene at fluence levels from approximately $1 \times 10^{13}$ ions/cm$^2$ to about $1 \times 10^{17}$ ions/cm$^2$, wherein the polydiacetylene is represented by the formula:

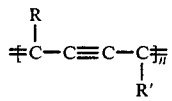

wherein the R—R' pairs are selected from the group consisting of:
R=—CH$_2$OSO$_2$C$_6$H$_4$CH$_3$ and R'=—CH$_2$OSO$_2$C$_6$H$_4$CH$_3$;
R=—CH$_2$OCONHC$_6$H$_5$ and R'=—CH$_2$OCONHC$_6$H$_5$;
R=—(CH$_2$)$_3$OCONHC$_6$H$_5$ and R'=—(CH$_2$)$_3$OCONHC$_6$H$_5$;
R=—(CH$_2$)$_4$OCONHC$_6$H$_5$ and R'=—(CH$_2$)$_4$OCONHC$_6$H$_5$;
R=—(CH$_2$)$_4$OCONHC$_2$H$_5$ and R'=—(CH$_2$)$_4$OCONHC$_2$H$_5$;
R=—(CH$_2$)$_4$OCONHCH(CH$_3$)$_2$ and R'=—(CH$_2$)$_4$OCONHCH(CH$_3$)$_2$;
R=—CH$_2$NC$_{12}$H$_8$ and R'=—CH$_2$NC$_{12}$H$_8$;
R=—(CH$_2$)$_2$OH and R'=—(CH$_2$)$_2$OH;
R=—(CH$_2$)$_3$OH and R'=—(CH$_2$)$_3$OH;
R=—COO(CH$_2$)$_8$CH$_3$ and R'=—COO(CH$_2$)$_8$CH$_3$; and
R=—CH$_2$OH and R'=—CH$_3$.

3. Electrically conductive ion implanted polydiacetylene in accordance with claim 2 wherein the fluence level is from about $1 \times 10^{14}$ ions/cm$^2$ to about $1 \times 10^{17}$ ions/cm$^2$.

4. Ion implanted polydiacetylene in accordance with claim 2 wherein said ion implanted polydiacetylene is prepared by implanting arsenic ions into the polydiacetylene.

5. Electrically conductive ion implanted polydiacetylene in accordance with claim 4 wherein the fluence level is from about $1 \times 10^{14}$ ions/cm$^2$ to about $1 \times 10^{17}$ ions/cm$^2$.

6. Ion implanted polydiacetylene in accordance with claim 4 wherein the R—R' pair is R=—CH$_2$OSO$_2$C$_6$H$_4$CH$_3$ and R'=—CH$_2$OSO$_2$C$_6$H$_4$CH$_3$.

7. Ion implanted polydiacetylene in accordance with claim 4 wherein the R—R' pair is R=—CH$_2$NC$_{12}$H$_8$ and R'=—CH$_2$NC$_{12}$H$_8$.

8. Ion implanted polydiacetylene in accordance with claim 4 wherein the R—R' pair is R=—(CH$_2$)$_4$OCONHC$_6$H$_5$ and R'=—(CH$_2$)$_4$OCONHC$_6$H$_5$.

* * * * *